(12) United States Patent
Klement et al.

(10) Patent No.: US 10,234,741 B2
(45) Date of Patent: Mar. 19, 2019

(54) ELECTRONIC DEVICE WITH HYBRID DISPLAY, AND CORRESPONDING SYSTEMS AND METHODS

(71) Applicant: Motorola Mobility LLC, Chicago, IL (US)

(72) Inventors: Alexander Klement, West Dundee, IL (US); Kevin Dao, Skokie, IL (US)

(73) Assignee: Motorola Mobility LLC, Chicago, IL (US)

( * ) Notice: Subject to any disclaimer, the term of this patent is extended or adjusted under 35 U.S.C. 154(b) by 0 days.

(21) Appl. No.: 15/244,912

(22) Filed: Aug. 23, 2016

(65) Prior Publication Data
US 2018/0059499 A1 Mar. 1, 2018

(51) Int. Cl.
| | | |
|---|---|---|
| G02B 26/00 | (2006.01) | |
| G02F 1/03 | (2006.01) | |
| G03G 17/04 | (2006.01) | |
| G09G 3/34 | (2006.01) | |
| G02F 1/167 | (2019.01) | |
| G02F 1/01 | (2006.01) | |
| H01L 27/32 | (2006.01) | |

(52) U.S. Cl.
CPC ............ *G02F 1/167* (2013.01); *G02F 1/0121* (2013.01); *G09G 3/344* (2013.01); *G09G 3/3413* (2013.01); *H01L 27/3232* (2013.01); *G02F 2201/44* (2013.01); *G09G 2300/023* (2013.01); *G09G 2300/0456* (2013.01); *H01L 27/3244* (2013.01)

(58) Field of Classification Search
CPC ... G02B 26/026; G02B 26/001; G02F 1/0123; G02F 1/167; G02F 2001/1678; G02F 1/172; G02F 2001/1672; G02F 1/07
USPC ........ 359/296, 253–254, 245, 290–291, 298; 349/33; 345/49, 105, 107; 430/31–32
See application file for complete search history.

(56) References Cited

U.S. PATENT DOCUMENTS

| | | | | |
|---|---|---|---|---|
| 6,144,361 | A * | 11/2000 | Gordon, II | .............. G02F 1/167 345/107 |
| 6,822,783 | B2 * | 11/2004 | Matsuda | ................. G02F 1/167 204/600 |
| 7,307,779 | B1 * | 12/2007 | Cernasov | ................ G02F 1/167 345/107 |
| 2015/0187282 | A1 * | 7/2015 | Lee | ........................ G09G 3/344 345/107 |

* cited by examiner

*Primary Examiner* — Dawayne Pinkney
(74) *Attorney, Agent, or Firm* — Philip H. Burrus, IV

(57) ABSTRACT

A display for an electronic device includes a plurality of pixel portions. Each pixel portion includes one or more electrophoretic capsules disposed above an organic light emitting diode layer. A first electrode assembly and a second electrode assembly are operable to control the one or more electrophoretic capsules. A control circuit selectively controls the first electrode assembly to cause operation of the one or more electrophoretic capsules in an optically non-transmissive state and the second electrode assembly to cause operation of the one or more electrophoretic capsules in an optically transmissive state.

20 Claims, 6 Drawing Sheets

ELECTRONIC DEVICE WITH HYBRID DISPLAY, AND CORRESPONDING SYSTEMS AND METHODS

BACKGROUND

Technical Field

This disclosure relates generally to electronic devices, and more particularly to electronic devices having visible displays.

Background Art

Mobile electronic communication devices are used by billions of people. People use mobile communication devices for many different purposes including, but not limited to, voice communications, text messaging, Internet browsing, commerce such as banking, and social networking. As these devices have become more sophisticated, so too have their displays and the information that can be presented on them. For example, not too long ago a mobile phone included a rudimentary light emitting diode display capable of only presenting numbers and letters configured as seven-segment characters. Today, high-resolution liquid crystal and other displays included with mobile communication devices and smart phones can be capable of presenting high-resolution video.

Modern high-resolution liquid crystal and other displays are not without their issues, however. For example, high-resolution displays consume relatively more power than do simple, low-resolution displays. Additionally, some high-resolution displays can be difficult to see in every environment. As they frequently employ light transmission to create images, they may be challenging to see in full sun, for example. It would be advantageous to have an improved display for an electronic device.

Figure 1:
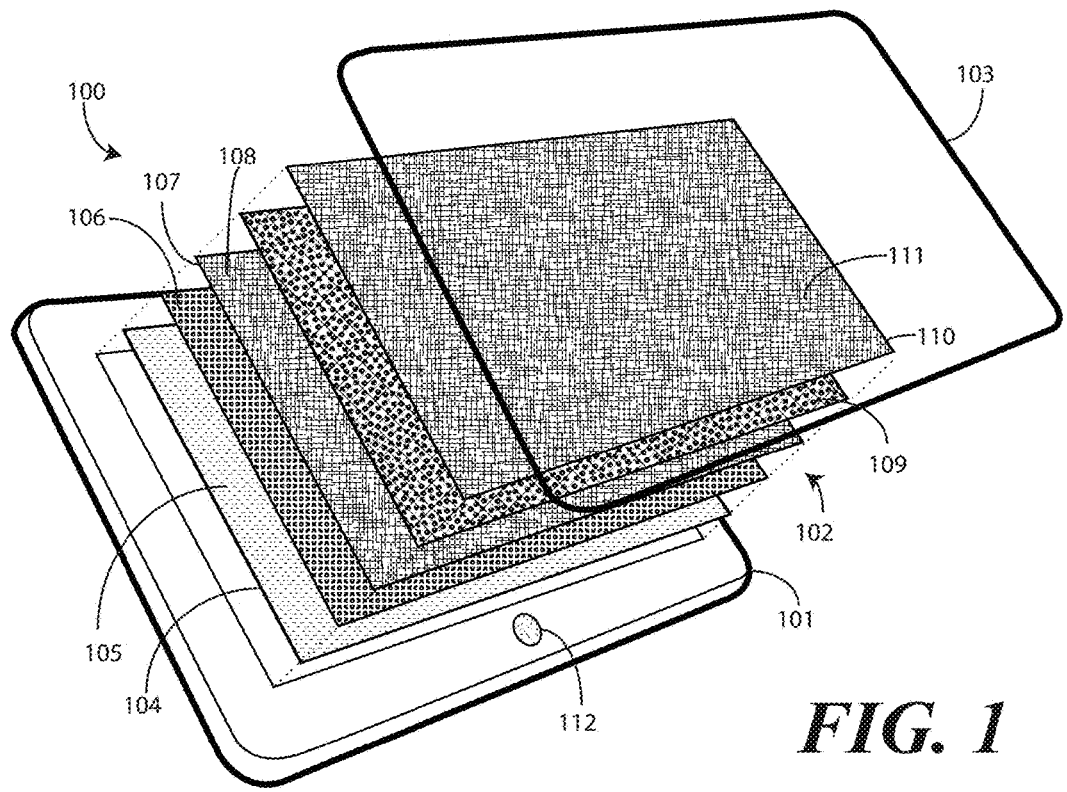
FIG. 1 illustrates an exploded diagram of one explanatory electronic device having a display in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to a display suitable for use with an electronic device to form a system as described herein. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

It will be appreciated that embodiments of the disclosure described herein may be comprised of one or more conventional processors and unique stored program instructions that control the one or more processors to implement, in conjunction with certain non-processor circuits, some, most, or all of the functions of a display operable to present images on a display operating in different modes as described herein. The non-processor circuits may include, but are not limited to, a radio receiver, a radio transmitter, signal drivers, clock circuits, power source circuits, and user input devices. As such, these functions may be interpreted as steps of a method to perform the presentation of images on a display operating in different modes in an electronic device. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

Embodiments of the disclosure provide a hybrid display that includes a combined light emitting diode display and charged pigment display that can present images either with the charged pigment portion of the display or with the light emitting diode portion of the display. In one embodiment, an organic light emitting diode display portion is formed using three layers: a thin film transistor matrix disposed along a first substrate, an electrode assembly disposed along an second substrate, and an organic light emitting diode layer disposed between the first substrate and the second substrate. A charged pigment portion can then be formed using only two additional layers, and sharing a layer with the organic light emitting diode portion. To wit, one or more electrophoretic capsules can be disposed along the second substrate. Another electrode assembly is then disposed along a third substrate. The one or more electrophoretic capsules are disposed between the second substrate and the third substrate, thereby defining a charged pigment portion.

The display can then work in either a first mode of operation, i.e., a charged pigment mode, or in a second mode of operation, i.e., a light-emitting mode. When operating in the charged pigment mode, the electrode assemblies disposed along the second and third substrates orient pigments in the electrophoretic capsules to present black and white images along the surface of the display. By contrast, when operating in the light-emitting mode, the transistor assemblies along the first and second substrates operate the organic light emitting diode layer to present images by projecting light outwardly from the display.

When operating in the light-emitting mode, it is necessary to move the charged pigments of the one or more electrophoretic capsules out of the way so that light emanating from the organic light emitting diode layer can pass through the electrophoretic capsules and out of the third substrate. In one or more embodiments, the display includes one or more vertical structures disposed about the one or more electrophoretic capsules between the second substrate and the third substrate. An electrode assembly is then disposed along these vertical structures.

In one or more embodiments, the electrode assemblies disposed along the vertical structures are electrically isolated from those disposed along the substrates by one or more dielectric layers. In one or more embodiments, the vertical structures occupy all or some of the same X-Y spaces as the X-Y spaces normally disposed between the pixels of a standard organic light emitting diode display. Said differently, the vertical structures can be placed in the "dead" or "dark areas" disposed between the organic light emitting diode pixels. In one or more embodiments, the vertical structures can be covered by printing, black masking, screening, or by disposing other materials along the third substrate.

When the electrode assemblies disposed along the vertical structures are energized, the charged particles in the electrophoretic capsules are drawn to the sides of the electrophoretic capsules, thereby allowing light from the organic light emitting diode layer to pass through an optically transmissive channel defined between the charged particles of the electrophoretic capsules and outwardly from the display. Accordingly, the display can function in a charged pigment mode by energizing the electrode assemblies disposed along the second substrate and third substrate. By contrast, the display can function in a light-emitting mode by energizing the electrode assemblies on the vertical structures and then using the electrode assemblies on the first substrate and the second substrate to control the organic light emitting diode layer. Advantageously, a hybrid display results that is capable of operating in both a charged pigment or "e-Ink" mode and in a light-emitting mode.

In one or more embodiments the resolution of the display when operating in the charged pigment mode is less than when operating in the light-emitting mode. Where this is the case, fewer than all of the inter-pixel space disposed between the pixels of the organic light emitting diode layer need to be filled with the vertical structures. In other embodiments, all inter-pixel spaces are filled with vertical structures to provide increased resolution.

In one or more embodiments, when the electrodes on the vertical structures are energized, and the electrode assemblies on the first and second substrates are actuated, the organic light emitting diode layer begins presenting images along the display. The electrodes disposed along the vertical structures cause the charged pigments within the electrophoretic capsules to move to the sides, thereby making the electrophoretic capsule layer optically transparent. This allows a user to see the pixels of the organic light emitting diode layer through the third substrate.

By contrast, when operating in the charged pigment mode, the electrodes on the vertical structures are switched OFF. The electrode assemblies on the second substrate and the third substrate then cause the charged pigments of the electrophoretic capsules to cause the display to present black and white indicia to the user.

The hybrid display in accordance with embodiments of the disclosure offers numerous advantages over prior art systems. Illustrating by example, when operating in the light-emitting mode, the organic light emitting diode layer offers a very fast refresh rate, improved resolution, and outstanding color performance. However, when operating in the charged pigment mode, static content, notifications, and other information that does not require the enhanced color, refresh rate, and resolution of the organic light emitting diode layer can be presented using the charged pigments of the electrophoretic capsules. Not only does this save power, thereby extending the run time of the electronic device employing the display, but it additionally offers increased visibility in some environments such as direct sunlight and can reduce user eye fatigue. Advantageously, by combining the best aspects of an electrophoretic display and an organic light emitting diode display, embodiments of the disclosure provide the best of both worlds in a mechanical structure that is only two layers thicker than a conventional organic light emitting diode display or a conventional electrophoretic display.

Turning now to FIG. 1, illustrated therein is one explanatory electronic device 100 configured in accordance with one or more embodiments of the disclosure. The explanatory electronic device 100 of FIG. 1 is shown as a tablet computer for illustrative purposes. However, it will be obvious to those of ordinary skill in the art having the benefit of this disclosure that other electronic devices may be substituted for the explanatory tablet computer of FIG. 1. For example, the electronic device 100 may be configured as a palm-top computer, a smartphone, a gaming device, wearable computer, a media player, or other device.

This illustrative electronic device 100 is shown in FIG. 1 in a partially exploded view so that various components can more clearly be seen. The electronic device 100 includes a housing 101, a display 102, and a fascia 103. Starting from the top, a fascia 103 is provided. In this illustrative embodiment, the fascia 103 defines a major face of the housing 101 disposed above the display 102. The fascia 103 may be manufactured from glass or a thin film sheet. The fascia 103 is a covering or housing, which may or may not be detachable. Suitable materials for manufacturing the cover layer include clear or translucent plastic film, glass, plastic, or reinforced glass. Reinforced glass can comprise glass strengthened by a process such as a chemical or heat treatment. The fascia 103 may also include a ultra-violet barrier. Such a barrier is useful both in improving the visibility of display 102 and in protecting internal components of the electronic device 100.

Printing may be desired on the front face of the fascia 103 for various reasons. For example, a subtle textural printing or overlay printing may be desirable to provide a translucent matte finish atop the fascia 103. Such a finish is useful to prevent cosmetic blemishing from sharp objects or fingerprints. The fascia 103 can include a plurality of indium tin oxide or other electrodes, which function as a capacitive sensor, to convert the display 102 to a touch-sensitive display. Where configured to be touch sensitive, users can deliver user input to the display 102 by delivering touch input from a finger, stylus, or other objects disposed proximately with the display.

Beneath the fascia 103 is disposed the display 102. The display 102 is supported by the housing 101 of the electronic device 100. In this illustrative embodiment, the display 102 is disposed between the housing 101 and the fascia 103. In one or more embodiments, the display 102 comprises a plurality of pixel portions. One example of such a pixel portion will be described below with reference to FIGS. 3-4. Another example will be described with reference to FIGS. 5-6. Still others will be obvious to those of ordinary skill in the art having the benefit of this disclosure.

In one embodiment, the display 102 comprises a plurality of layers. Beginning at the bottom, a first substrate 104 has a first electrode structure 105 disposed thereon. In one embodiment, the first electrode structure 105 comprises a plurality of transistors deposited along the first substrate as a thin film transistor layer. The transistors of the thin film transistor layer will be described in more detail below with reference to FIGS. 3-4. The thin film transistor layer can be deposited directly upon the first substrate 104 in one embodiment. Alternatively, a lamination adhesive can couple the thin film transistor layer to the first substrate 104.

Above the first substrate 104 is disposed an organic light emitting diode layer 106. In one or more embodiments, the organic light emitting diode layer 106 comprises one or more light emitting devices. In one embodiment, the one or more light emitting devices define an array of pixels. Additional details of these light emitting devices, and the pixels they define, will be described below with reference to FIGS. 3-6.

Above the organic light emitting diode layer 106 is a first optically transparent substrate 107. A second electrode structure 108 is disposed along the first optically transparent substrate 107. In one or more embodiments, the second electrode structure 108 comprises one or more transparent electrodes. These transparent electrodes can be manufactured by depositing indium-tin oxide ($In_2O_3$-$SnO_2$), often in the shape of pixels, to apply selective electric fields to the pixels of the organic light emitting diode layer 106, thereby presenting images to a user on the display 102. The first electrode structure 105 and the second electrode structure 108, in one embodiment, comprise a first electrode assembly. A control circuit (shown below in FIG. 2) is operable with the first electrode assembly, i.e., the first electrode structure 105 and the second electrode structure 108, to cause the light emitting devices of the organic light emitting diode layer 106 to present images, text, and other indicia along the surface of the display 102.

Disposed above the first optically transparent substrate 107 is a layer of one or more electrophoretic capsules 109. The electrophoretic capsules can be manufactured by suspending particles in a medium disposed within each capsule. Examples of such media include gas, liquid, or gel. The particles may optionally be emulsified in a polymeric matrix. The particles have optical properties that are different from the medium in which they are suspended. Due to the electrochemical properties of the particles, and of the medium, the particles spontaneously acquire a net charge when placed in the medium. Having a charge, the particles will move in the presence of an externally applied electric field. When electric fields are applied to the electrophoretic capsules, these particles rotate and move within the capsules to selectively present information along the viewable display surface. This movement causes an image to appear at the viewable display surface. Electrophoretic displays tend to be both very efficient in terms of electrical current consumption. Further they are generally available at a reasonable cost.

Disposed above the layer of one or more electrophoretic capsules 109 is a second optically transparent substrate 110. A third electrode structure 111 is disposed along the second optically transparent substrate 110. In one or more embodiments, the third electrode structure 111 comprises one or more transparent electrodes, such as those manufactured by depositing indium-tin oxide or other optically transparent, electrically conductive materials along the second optically transmissive substrate. The second electrode structure 108 and the third electrode structure 111, in one embodiment, comprise as second electrode assembly. A control circuit can control the second electrode assembly to present images with the one or more electrophoretic capsules 109 on the display 102.

In one or more embodiments, the first substrate 104, with its first electrode structure 105, the organic light emitting diode layer 106, and the first optically transparent substrate 107, with its second electrode structure 108, define an organic light emitting diode display portion of the display 102. In one or more embodiments, this organic light emitting diode display portion is an active matrix organic light emitting diode display. However, it should be noted that other types of displays can be constructed by replacing these layers with other layers. For example, in another embodiment these lower layers can comprise a liquid crystal display. Still other display types will be obvious to those of ordinary skill in the art having the benefit of this disclosure. Operation of the organic light emitting diode display portion will be described in more detail with reference to FIGS. 4 and 6 below.

In one embodiment, the organic light emitting diode display portion comprises a high-resolution display. The term "high-resolution display" is used herein to refer to a display device that can present text and images to a user by altering a large number of pixels which, when viewed collectively by a user, form the presented text or image. The high-resolution display can be used for the presentation of text, information, and graphics on a mobile device with sufficient granularity as to be easily switched between graphics or text. For example, the high-resolution display could be one suitable for presenting an image in the Joint Photographics Expert Group (JPG) format to the user. Such displays generally are configured to turn on and off individual pixels by way of a display driver for the presentation of high-resolution information.

In one or more embodiments, the first optically transparent substrate 107, with its second electrode structure 108, the layer of one or more electrophoretic capsules 109, and the second optically transparent substrate 110, with its third electrode structure 111, define a charged pigment display portion of the display 102. In one or more embodiments, the charged pigment display portion is configured as an electrophoretic display or "electronic-ink" display. However, it should be noted that other types of displays can be constructed by replacing these layers with other layers. For example, other display types, including those operating by moving particles electrophoretically in gels, powders, gasses, or other transfer media, may also be constructed in the upper layers of the display 102. Operation of the charged pigment display portion will be described in more detail below with reference to FIGS. 3 and 5.

This explanatory electronic device 100 also includes a housing 101. Features can be incorporated into the housing 101. Examples of such features include a microphone or speaker port. In this illustrative embodiment, a user interface component 112, which may be a button or touch sensitive surface, can also be disposed along the housing 101 as shown in FIG. 1.

Figure 2:
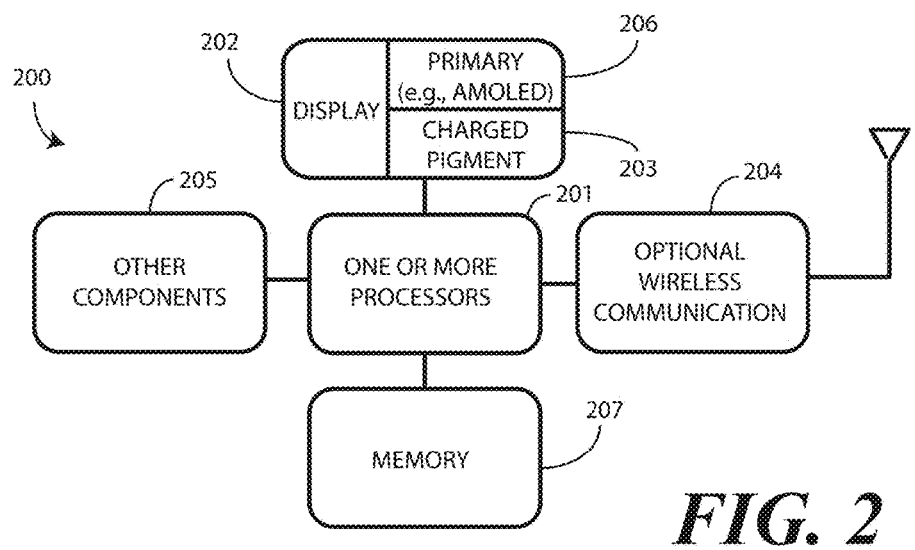
FIG. 2 illustrates a schematic block diagram of one explanatory electronic device having a display in accordance with one or more embodiments of the disclosure.

Turning now to FIG. 2, illustrated therein is a schematic block diagram 200 of an explanatory electronic device configured in accordance with one or more embodiments of the disclosure. In one embodiment, the electronic device includes a control circuit 201. The control circuit 201 is operable with the display 202 and other components of the electronic devices configured in accordance with embodiments of the disclosure. In this illustrative embodiment, the display 202 includes both the charged pigment display portion 203 and the organic light emitting diode display portion 206 described above.

The control circuit 201 can include a microprocessor, a group of processing components, one or more ASICs, programmable logic, or other type of processing device. The control circuit 201 can be operable with the various components of the electronic devices configured in accordance with embodiments of the disclosure. The control circuit 201 can be configured to process and execute executable software code to perform the various functions of the electronic devices configured in accordance with embodiments of the disclosure.

A storage device, such as memory 207, can optionally store the executable software code used by the control circuit 201 during operation. The memory 207 may include either or both static and dynamic memory components, may be used for storing both embedded code and user data. The software code can embody program instructions and methods to operate the various functions of the electronic device devices configured in accordance with embodiments of the disclosure, and also to execute software or firmware applications and modules. The control circuit 201 can execute this software or firmware, and/or interact with modules, to provide device functionality.

In this illustrative embodiment, the schematic block diagram 200 also includes an optional communication circuit 204 that can be configured for wired or wireless communication with one or more other devices or networks. The networks can include a wide area network, a local area network, and/or personal area network. Examples of wide area networks include GSM, CDMA, W-CDMA, CDMA-2000, iDEN, TDMA, 2.5 Generation 3GPP GSM networks, 3rd Generation 3GPP WCDMA networks, 3GPP Long Term Evolution (LTE) networks, and 3GPP2 CDMA communication networks, UMTS networks, E-UTRA networks, GPRS networks, iDEN networks, and other networks.

The communication circuit 204 may also utilize wireless technology for communication, such as, but are not limited to, peer-to-peer or ad hoc communications such as HomeRF, Bluetooth and IEEE 802.11 (a, b, g or n); and other forms of wireless communication such as infrared technology. The communication circuit 204 can include wireless communication circuitry, one of a receiver, a transmitter, or transceiver, and one or more antennas.

The control circuit 201 can also be operable with other components 205. The other components 205 can include an acoustic detector, such as a microphone. The other components 205 can also include one or more proximity sensors to detect the presence of nearby objects. The other components 205 may include video input components such as optical sensors, mechanical input components such as buttons, touch pad sensors, touch screen sensors, capacitive sensors, motion sensors, and switches. Similarly, the other components 205 can include output components such as video, audio, and/or mechanical outputs. Other examples of output components include audio output components such as speaker ports or other alarms and/or buzzers and/or a mechanical output component such as vibrating or motion-based mechanisms. The other components 205 may further include an accelerometer to show vertical orientation, constant tilt and/or whether the device is stationary.

The control circuit 201 can be responsible for performing the primary functions of the electronic devices configured in accordance with one or more embodiments of the disclosure. For example, in one embodiment the control circuit 201 comprises one or more circuits operable with one or more user interface devices, which can include the display 202, to present presentation information to a user. The executable software code used by the control circuit 201 can be configured as one or more modules that are operable with the control circuit 201. Such modules can store instructions, control algorithms, and so forth.

It is to be understood that FIG. 2 is provided for illustrative purposes only and for illustrating components of explanatory electronic devices configured in accordance with one or more embodiments of the disclosure, and is not intended to be a complete schematic diagram of the various components required for an electronic device. Therefore, other electronic devices in accordance with embodiments of the disclosure may include various other components not shown in FIG. 2, or may include a combination of two or more components or a division of a particular component into two or more separate components, and still be within the scope of the present disclosure.

Figure 3:
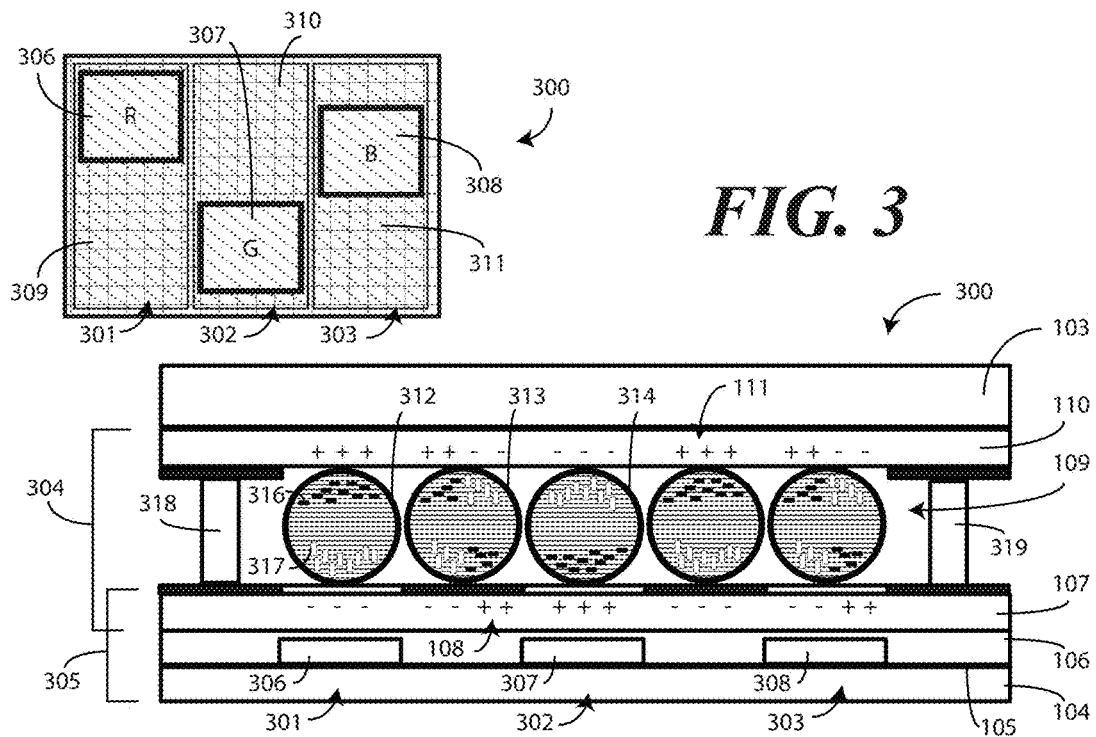
FIG. 3 illustrates one explanatory display operating in a first mode in accordance with one or more embodiments of the disclosure.

Turning now to FIG. 3, illustrated therein are both a plan view and a sectional view of one explanatory pixel portion 300 suitable for use with a display (102,202) configured in accordance with one or more embodiments of the disclosure. As best seen in the sectional view, in this illustrative embodiment the pixel portion 300 includes both a charged pigment display portion 304 and an organic light emitting diode display portion 305.

As shown, the pixel portion 300 includes three subpixels, namely a first subpixel 301, a second subpixel 302, and a third subpixel 303. In this illustrative embodiment, each subpixel comprises a single light-emitting element. For example, in one embodiment, the first subpixel 301 comprises a first light emitting device 306 that emits a first color of light, while the second subpixel 302 comprises a second light emitting device 307 that emits a second color of light. A third subpixel 303 comprises a third light emitting device 308 that emits a third color of light. The three colors combine to create a desired color for the presentation of images.

In one embodiment, the first subpixel 301 comprises a red subpixel, while the second subpixel 302 comprises a green subpixel. The third subpixel 303 then comprises a blue subpixel. In some embodiments the third subpixel 303 may be larger than the first subpixel 301 and the second subpixel 302 because light emitting devices producing blue light sometimes have a shorter lifespan than do light emitting devices 306,307 emitting red or green light.

The illustrative pixel portion 300 of FIG. 3 includes layers similar to that described above with reference to FIG. 1. Starting from the top, a fascia 103 is provided. The fascia 103 can be manufactured from clear or translucent plastic film, glass, plastic, or reinforced glass. Still other materials will be obvious to those of ordinary skill in the art having the benefit of this disclosure.

Moving to the bottom of the pixel portion 300, a first substrate 104 has a first electrode structure 105 disposed thereon. In one embodiment, the first electrode structure 105 comprises various components 309,310,311 deposited along the first substrate 104 as a thin film transistor layer. These components 309,310,311 can include thin film transistors and/or capacitors for energy storage. The components 309, 310,311 can include a driver circuit comprising four to six thin film transistors and one to two energy storage capacitors. The energy storage capacitors stores a charge sufficient to actuate the light emitting devices 306,307,308 of the pixel portion 300, while the thin film transistors regulate when the energy storage capacitors charge and discharge. Other components to be included in the first electrode structure 105 will be obvious to those of ordinary skill in the art having the benefit of this disclosure.

An organic light emitting diode layer 106 is disposed above the first substrate 104. The organic light emitting diode layer 106 provides the light emitting devices 306,307, 308. Above the organic light emitting diode layer 106 is a first optically transparent substrate 107. A second electrode structure 108 is disposed along the first optically transparent substrate 107.

In one or more embodiments, the first substrate 104, with its first electrode structure 105, the organic light emitting diode layer 106, and the first optically transparent substrate 107, with its second electrode structure 108, define an organic light emitting diode display portion 305. When a control circuit (201) actuates a first electrode assembly, i.e., the first electrode structure 105 and the second electrode structure 108, it can control the light emitting devices 306,307,308 of the organic light emitting diode layer 106 to present images, text, and other indicia to a user.

Continuing up the stack, disposed above the first optically transparent substrate 107 is a layer of one or more electrophoretic capsules 109. An optional, optically-transmissive lamination adhesive (not show) can be placed between the layer of one or more electrophoretic capsules 109 and the first optically transparent substrate 107 to bond and seal the perimeters of a chamber in which the layer one or more electrophoretic capsules 109 are disposed.

In this illustrative embodiment, each electrophoretic capsule 312,313,314 encloses a medium 315, such as hydrocarbon oil in liquid based electrophoretic materials, with light particles 317 and dark particles 316 suspended therein. Some of these particles 317, which may be made from titanium dioxide, are generally white, and are therefore reflective across the visible spectrum. Other particles 316 may be pigmented with a dark colored dye so as to appear black. With surfactants and charging agents, the white particles 317 are positively charged while the black particles 316 are negatively charged.

Disposed above the layer of one or more electrophoretic capsules 109 is a second optically transparent substrate 110. A third electrode structure 111 is disposed along the second optically transparent substrate 110. In one or more embodiments, the third electrode structure 111 comprises one or more transparent electrodes, such as those manufactured by depositing indium-tin oxide or other optically transparent, electrically conductive materials along the second optically transmissive substrate.

In one or more embodiments, when a control circuit (201) actuates the second electrode assembly, i.e., the second electrode structure 108 and the third electrode structure 111, it can control the layer of one or more electrophoretic capsules 109 to present images, text, and other indicia to a user. Illustrating by example, when an electric field is applied to each electrophoretic capsule 312,313,314 by the second electrode structure 108 and the third electrode structure 111, the particles 316,317 migrate electrophoretically so as to form an image viewable to the user. When the white particles 317 move to the top of the electrophoretic capsule 312,313,314 they become visible as the color white to the user from the front side of the pixel portion 300. At the same time, the electric field pulls the black particles 316 to the bottom of the electrophoretic capsule 312,313,314 where they are hidden from view. By reversing this process, the black particles 316 appear at the top of the electrophoretic capsule 312,313,314, which becomes visible as the color black.

The pixel portion 300 is shown operating in the charged pigment display mode in FIG. 3. Accordingly, the control circuit (201) controls the second electrode structure 108 and the third electrode structure 111 to present images, text, and other indicia to a user by migrating the particles 316,317 electrophoretically to the top and bottom of each electrophoretic capsule 312,313,314 so as to form an image viewable to the user when operating in a charged pigment mode.

Embodiments of the disclosure contemplate that it is desirable to use the pixel portion 300 in both the charged pigment display mode and in a light emitting diode mode. However, as shown in FIG. 3, if the light emitting devices 306,307,308 are actuated, the optically non-transmissive properties of the particles 316,317 present in each electrophoretic capsule 312,313,314 would prevent light from passing upward and out of the pixel portion 300.

To allow light from the light emitting devices 306,307, 308 to escape, one or more vertical structures 318,319 are disposed between the first optically transparent substrate 107 and the second optically transparent substrate 110. The vertical structures can be formed from adhesive layers, resin layers, from thermoplastics, or from other materials that provide mechanical separation between the first optically transparent substrate 107 and the second optically transparent substrate 110 and to define a chamber for the electrophoretic capsules 312,313,314. Other materials suitable for use as the vertical structures 318,319 will be obvious to those of ordinary skill in the art having the benefit of this disclosure.

In one or more embodiments, one or more electrode assemblies (shown below in FIG. 4) are disposed along these vertical structures 318,319. By controlling these electrode assemblies, a control circuit (201) can cause the particles 316,317 to move to the sides of each electrophoretic capsule 312,313,314, rather than to the top and bottom. This creates an optically transmissive channel between the particles 316,317, thereby allowing light to pass through each electrophoretic capsule 312,313,314. This mode of operation is shown in FIG. 4.

Figure 4:
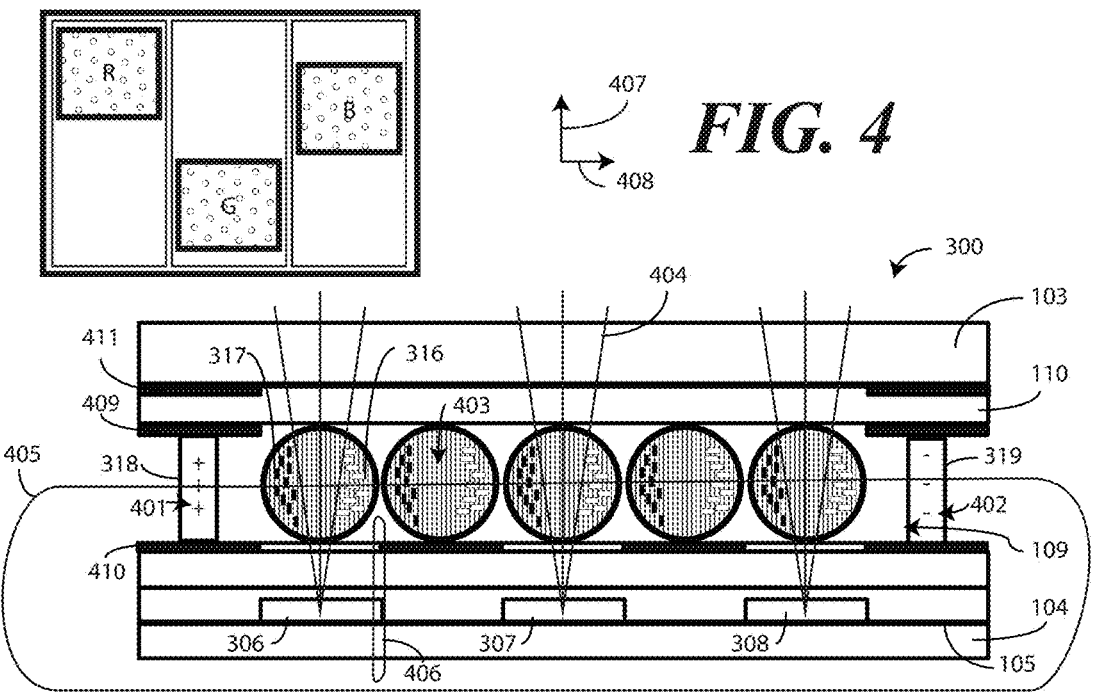
FIG. 4 illustrates one explanatory display operating in a second mode in accordance with one or more embodiments of the disclosure.

Turning now to FIG. 4, a first electrode structure 401 is disposed along the first vertical structure 318. Similarly a second electrode structure 402 is disposed along the second vertical structure 319. The first electrode structure 401 and the second electrode structure 402 comprise, in one or more embodiments, a third electrode assembly. In this illustrative embodiment, the first electrode structure 401 and the second electrode structure 402 are disposed between the first optically transparent substrate 107 and the second optically transparent substrate 110. Where desired, one or more electrically insulating elements 409,410 can be used to electrically isolate the first electrode structure 401 and the second electrode structure 402 from either the second electrode structure 108 or the third electrode structure 111.

In one or more embodiments, when a control circuit (201) actuates the third electrode assembly, i.e., the first electrode structure 401 and the second electrode structure 402, it can control the layer of one or more electrophoretic capsules 109 to separate the particles 316,317 therein to define an optically transparent channel 403 through the middle of each electrophoretic capsule 312,313,314. The control circuit (201) can then actuate the first electrode structure 105 disposed along the first substrate 104 and the second electrode structure 108 disposed along the first optically transparent substrate 107 to cause the light emitting devices 306,307,308 to emit light 404 to produce images. Said differently, in one or more embodiments, a control circuit (201) can selectively actuate one or more of these light emitting devices 306,307,308 when the electrophoretic capsules define the optically transparent channel, i.e., are operating in an optically transmissive state as seen by the light emitting devices 306,307,308, to produce images.

Light 404 from the light emitting devices 306,307,308 can then pass through the optically transparent channel 403, through the second optically transparent substrate 110, through the fascia 103, and outward to the eye of a viewer. Accordingly, in one or more embodiments, the control circuit (201) can actuate the first electrode structure 401 disposed along the first vertical structure 318 and the second electrode structure 402 disposed along the second vertical structure 319 to create the optically transparent channels 403 through the electrophoretic capsules 312,313,314, and the first electrode structure 105 disposed along the first substrate 104 and the second electrode structure 108 disposed along the first optically transparent substrate 107 to cause the light emitting devices 306,307,308 to emit light 404 to present images, text, and other indicia to a user when operating in a light emitting mode.

By comparing the first mode of operation occurring in FIG. 3, and the second mode of operation occurring in FIG. 4, advantages of the hybrid display constructed with these pixel portions 300 becomes apparent. Each pixel portion 300 includes one or more electrophoretic capsules 312,313,314. A control circuit (201) can, for example, control the first electrode assembly, e.g., the first electrode structure 105 and the second electrode structure 108, to cause operation of the one or more electrophoretic capsules 312,313,314 in an optically non-transmissive state by causing, as shown in FIG. 3, particles 316,317 to migrate electrophoretically to the top and bottom of each electrophoretic capsule 312,313, 314 so as to form an image viewable to the user. When the white particles 317 move to the top of the electrophoretic capsule 312,313,314 they become visible as the color white to the user from the front side of the pixel portion 300. When black particles 316 appear at the top of the electrophoretic capsule 312,313,314, these particles 316 become visible as the color black. As the particles 316,317 prevent light 404 from the light emitting devices 306,307,308 from leaving the display, the charged pigment mode occurring in FIG. 3 occurs when the electrophoretic capsules 312,313,314 are operating in an "optically non-transmissive state" as seen by the light emitting devices 306,307,308.

By contrast, when the control circuit (201) controls the third electrode assembly, e.g., electrode structure 401 and electrode structure 402, this causes the particles 316,317 of the electrophoretic capsules 312,313,314 to separate horizontally, i.e., parallel to a major dimension of the fascia 103, therein to define an optically transparent channel 403 through the middle of each electrophoretic capsule 312,313, 314. The control circuit (201) can then actuate the first electrode structure 105 disposed along the first substrate 104 and the second electrode structure 108 disposed along the first optically transparent substrate 107 to cause the light emitting devices 306,307,308 to emit light 404 to produce images. As the particles 316,317 allow light 404 from the light emitting devices 306,307,308 to leave the display, the light emitting mode occurring in FIG. 4 occurs when the electrophoretic capsules 312,313,314 are operating in an "optically transmissive state" as seen by the light emitting devices 306,307,308.

As shown in FIG. 4, in this illustrative embodiment the one or more electrophoretic capsules 312,313,314 are disposed between the second electrode structure 108 disposed on the first optically transparent substrate 107 and the third electrode structure 111 disposed along the second optically transparent substrate 110 in a direction along a first axis 407. The one or more electrophoretic capsules 312,313,314 are disposed between the electrode structure 401 disposed along the first vertical structure 318 and the electrode structure 402 disposed along the second vertical structure 319 in a direction along a second axis 408. In this illustrative embodiment, the first axis 407 is substantially orthogonal to the second axis 408. As viewed in the sectional view of the pixel portion 300 of FIG. 4, the first axis 407 is the "Z-axis," while the second axis 408 is one of the "X-axis" or the "Y-axis."

In one or more embodiments, the electrode assembly applying a horizontal electric field 405 along the second axis 408, i.e., first electrode structure 401 and second electrode structure 402, applies a stronger electric field to the one or more electrophoretic capsules 312,313,314 than the electrode assembly applying the vertical electric field 406 along the first axis 407, i.e., first electrode structure 105 and second electrode structure 108, when in operation in the light emitting mode. This can be desirable because operation of the second electrode structure 108, to control the one or more light emitting devices 306,307,308, can cause movement of the particles 316,317 disposed within each electrophoretic capsule 312,313,314. Accordingly, a stronger horizontal electric field 405 may be required to maintain each optically transparent channel 403 defined within each electrophoretic capsule 312,313,314.

In one or more embodiments, it can be desirable to add printing or other media to one of the upper layers of the pixel portion 300 to prevent the vertical structures 318,319 from being visible. Accordingly, in one or more embodiments an optically non-transmissive material 411,412 is disposed on the second optically transparent substrate 110 at locations corresponding to the vertical structures 318,319 and/or electrode structure 401 and electrode structure 402. Alternatively, this optically non-transmissive material 411,412 can be disposed along the fascia 103 as well at locations corresponding to the vertical structures 318,319 and/or electrode structure 401 and electrode structure 402. Examples of optically non-transmissive materials 411,412 include printing, black masking, screening, other materials.

Figure 5:
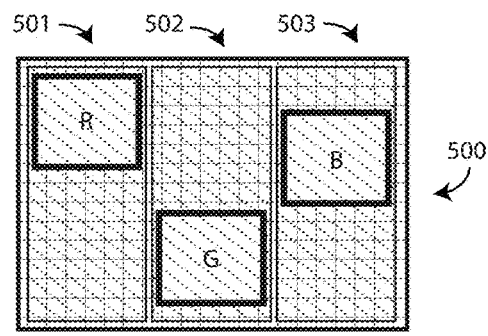
FIG. 5 illustrates another explanatory display operating in a first mode in accordance with one or more embodiments of the disclosure.
Figure 5:
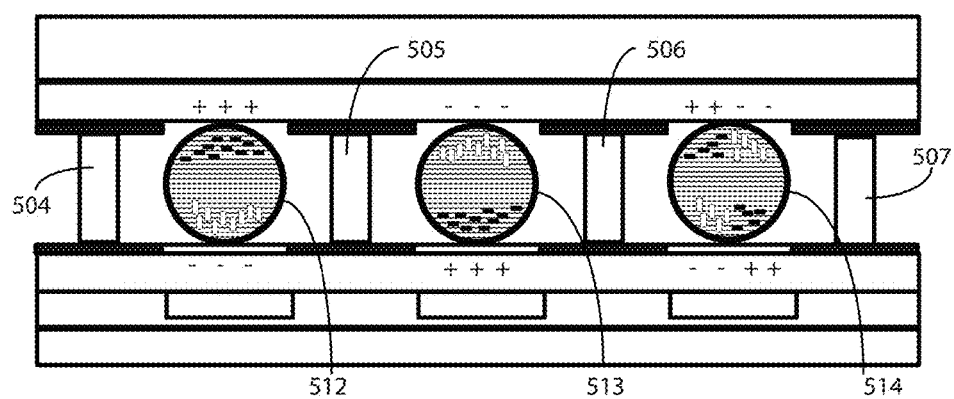
Figure 6:
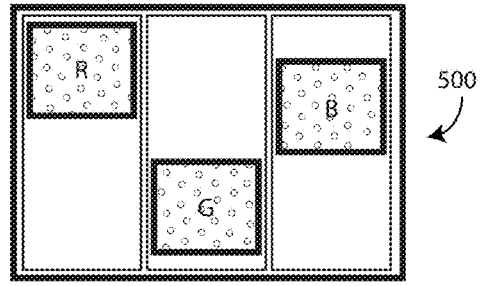
FIG. 6 illustrates another explanatory display operating in a second mode in accordance with one or more embodiments of the disclosure.
Figure 6:
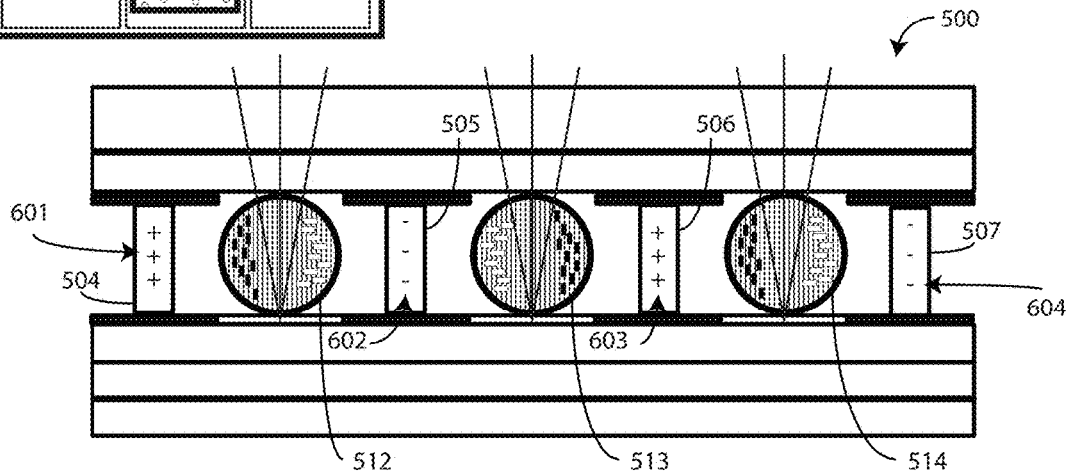

As noted above, in one or more embodiments the electrode assembly disposed along the vertical structures 318, 319 occupies all or some of the same X-Y spaces as the X-Y spaces normally disposed between the pixel portions 300 of a standard organic light emitting diode display. Said differently, the vertical structures can be placed in the "dead" or "dark areas" disposed between the organic light emitting diode pixels. Such is the case in FIGS. 3-4. However, turning now to FIGS. 5-6, illustrated therein is another pixel portion 500 that includes vertical structures 504,505,506, 507 disposed between the subpixels 501,502,503. Each vertical structure 504,505,506,507 has an electrode structure disposed therealong.

This finer resolution offered by including additional vertical structures 504,505,506,507 allows, in one or more embodiments, individual control of the electrophoretic capsules 512,513,514. Rather than controlling a layer of one or more electrophoretic capsules with a single electrode assembly, in the embodiment of FIGS. 5-6, each electrophoretic capsule 512,513,514 can be controlled by its own electrode assembly.

For example, turning now to FIG. 6, a first electrode structure 601 is disposed along a first vertical structure 504, while a second electrode structure 602 is disposed along a second vertical structure 505. The first electrode structure 601 and the second electrode structure 602 define a first electrode assembly. Similarly, a third electrode structure 603 is disposed along a third vertical structure 506, while a fourth electrode structure 605 is disposed along a fourth vertical structure 507. The second electrode structure 602 and the third electrode structure 603 define a second electrode assembly, while the third electrode structure 603 and the fourth electrode structure 604 define a third electrode assembly.

In one or more embodiments, when a control circuit (201) actuates these electrode assemblies, it can individually control the electrophoretic capsules 512,513,514 to separate the particles therein to define one or more optically transparent channels through the middle of each electrophoretic capsule 512,513,514 as previously described. The operation of the pixel portion 500 is otherwise the same as that described above with reference to FIGS. 3-4. The pixel portion 500 is operating in the charged pigment mode in FIG. 5, with the electrophoretic capsules 512,513,514 operating in an optically non-transmissive mode as seen by the light sources of the organic light emitting diode layer. By contrast, the pixel portion 500 is operating in a light emitting mode in FIG. 6, with the electrophoretic capsules 512,513,514 operating in an optically transmissive mode as seen by the light sources of the light emitting diode layer.

The provision of a dual charged pigment/light emitting display technology, as provided by the pixel portions (300, 500) described above, offers numerous advantages for a user. While AMOLED displays and other light emitting diode displays are lightweight, have excellent contrast ratios, and perform fabulously in normal and low-light environments, they can be difficult to see in full sun. By contrast, charged pigment or electronic ink displays are easily visible in the sun, as they use reflected ambient light instead of transmitting light from a light source. Accordingly, in one or more embodiments the control circuit (201) may transition a display (102) configured in accordance with embodiments of the disclosure to the light-emitting mode (FIGS. 3 and 5) when indoors or in low light environments. However, the control circuit (201) can transition the display (102) to the charged pigment mode (FIGS. 4 and 6) in bright light or sunny conditions. The control circuit (201) may employ an imager or light sensor to determine the amount of ambient light in one or more embodiments.

Second, some professionals suggest that two much light projected into the eyes prior to bedtime can alter sleep patterns. Accordingly, a user may use an input device such as a user interface component (112) to transition the display (102) to the charged pigment mode for reading prior to bedtime to reduce projected light.

Third, when the display (102) is operating in the charged pigment mode, it will consume less power than when operating in the light-emitting mode. This is true for at least two reasons: First, unlike light emitting diode displays, when the display (102) is operating in the charged pigment mode, no backlight is required. Second, once the electrophoretic capsules are moved into position to render presentation information, the capsules stay in this orientation until they are again moved. Accordingly, the display (102), when operating in the charged pigment mode, uses less power by only selectively moving the capsules and by not requiring the necessary power to operate a backlighting system. This translates into an advantage for the user in that the user can extend the battery life of an electronic device (100) by opting to use the display (102) in a charged pigment mode to view notifications, the time of day, electronic mail communication, electronic messages, web pages, electronic books, and so forth.

Figure 7:
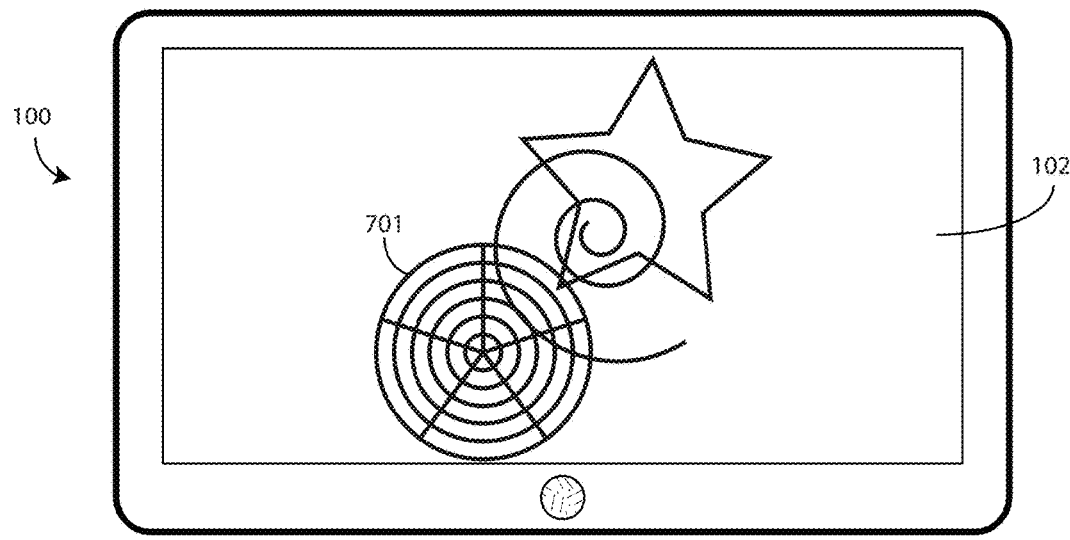
FIG. 7 illustrates an electronic device having a display operating in a first mode in accordance with one or more embodiments of the disclosure.
Figure 8:
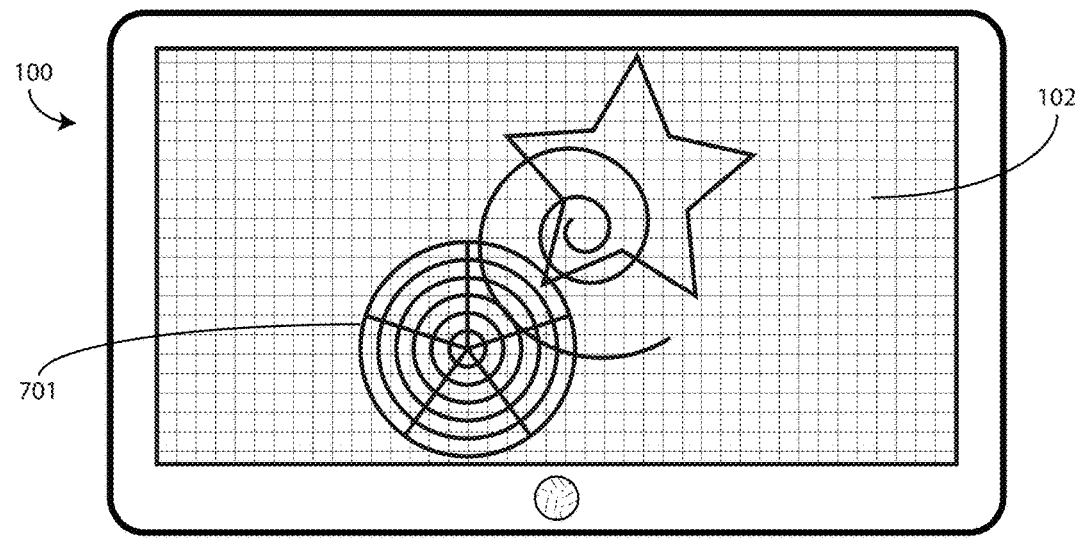
FIG. 8 illustrates the electronic device of FIG. 7 with the display operating in a second mode in accordance with one or more embodiments of the disclosure.

Turning now to FIGS. 7-8, illustrated therein is the electronic device 100 operating in different modes. As shown in FIG. 7, the electronic device 100 is operating in the light-emitting mode. Indicia 701, which can be pictures, images, text, video, or other information, is being presented on the display 102 with a high resolution, high color differentiation, and a high refresh rate. However, as shown at FIG. 8, the same indicia 701 can be presented on the display 102 when operating in the charged pigment mode. While the color, resolution, and refresh rates are not as high, power consumption is greatly reduced.

Figure 9:
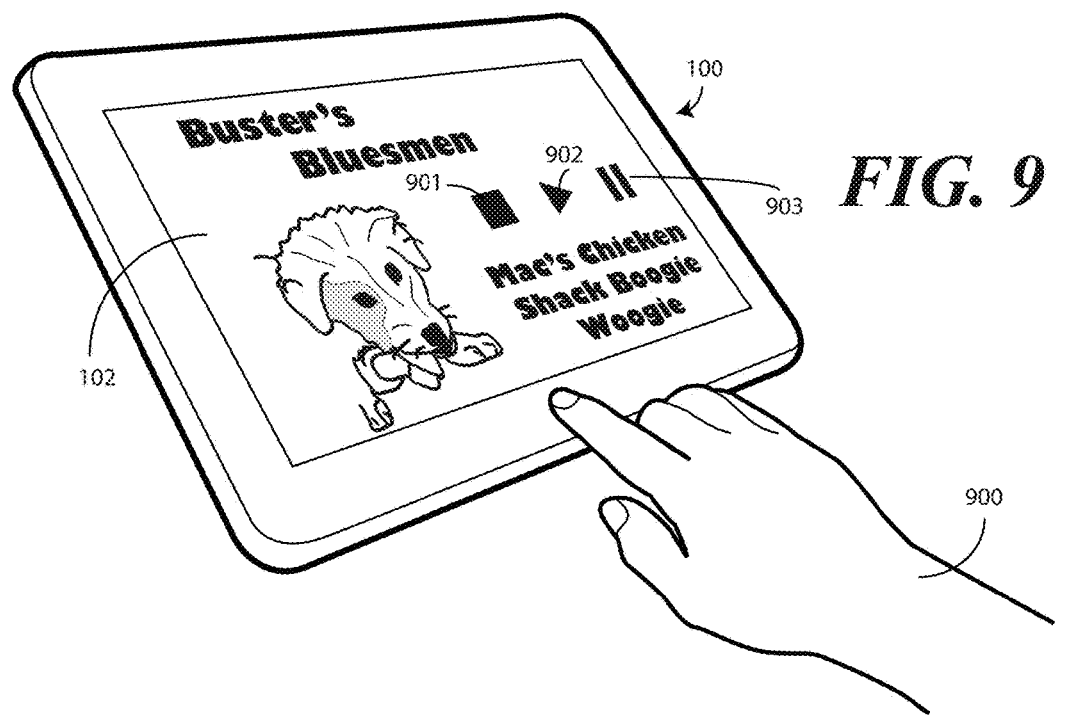
FIG. 9 illustrates another electronic device having a display operating in a first mode in accordance with one or more embodiments of the disclosure.
Figure 10:
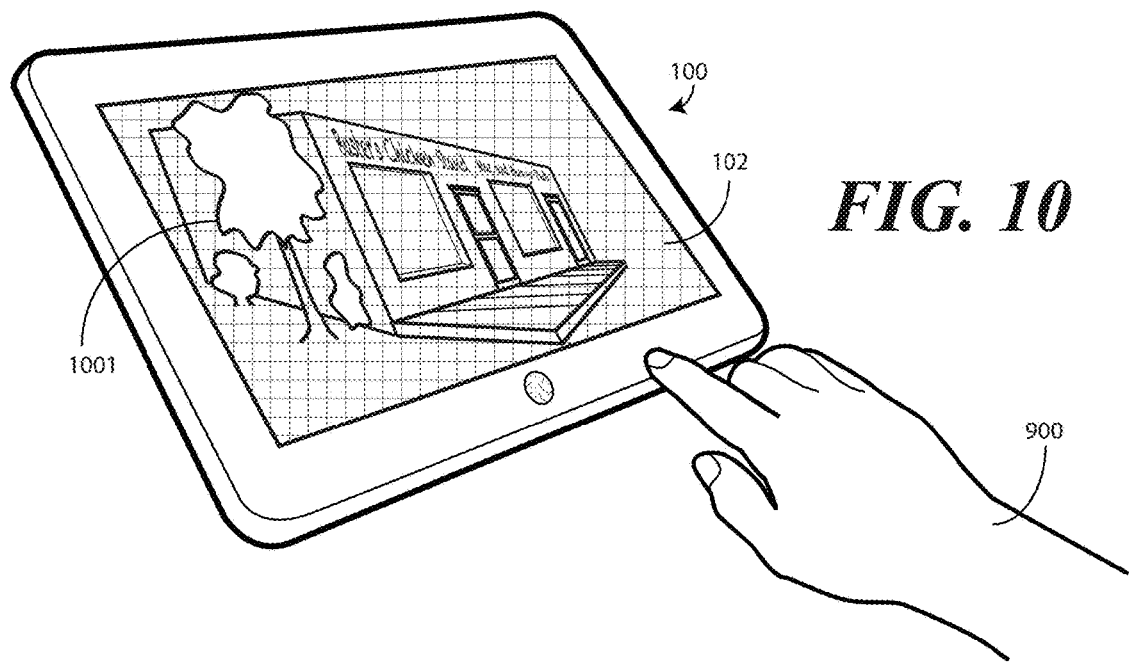
FIG. 10 illustrates the electronic device of FIG. 9 with the display operating in a second mode in accordance with one or more embodiments of the disclosure.

Turning now to FIGS. 9 and 10, a user 900 is interacting with the electronic device 100 in a power saving mode. The electronic device 100 is operating in a music player mode. At FIG. 9, the user 900 is interacting with the display 102 while the display 102 operates in the light-emitting mode. The higher refresh rate of this mode is advantageous when the user 900 is selecting a song, which in this case is Mac's Chicken Shack Boogie Woogie by the infamous Buster and his Bluesmen. Since the user 900 may interact with one or more user actuation targets 901,902,903 to play or pause the song, operation in the light-emitting mode is desirable. Accordingly, the one or more electrophoretic capsules of the display 102 are operating an optically transmissive state due to the fact that the control circuit (201) causes a first electrode assembly to apply a first electric field to the one or more electrophoretic capsules.

However, as shown in FIG. 10, the user 900 has ceased interacting with the display 102 and is only listening to the song. Accordingly, in one or more embodiments a control circuit (201) disposed within the electronic device 100 causes the one or more electrophoretic capsules to operate in operating in an optically non-transmissive state by actuating a second electrode assembly to apply a second electric field to the one or more electrophoretic capsules. Accordingly, the display 102 operates in a charged pigment mode and presents the album cover art 1001 on the display using the electrophoretic capsules while the light emitting devices of the organic light emitting diode layer are OFF. This saves power.

Figure 11:
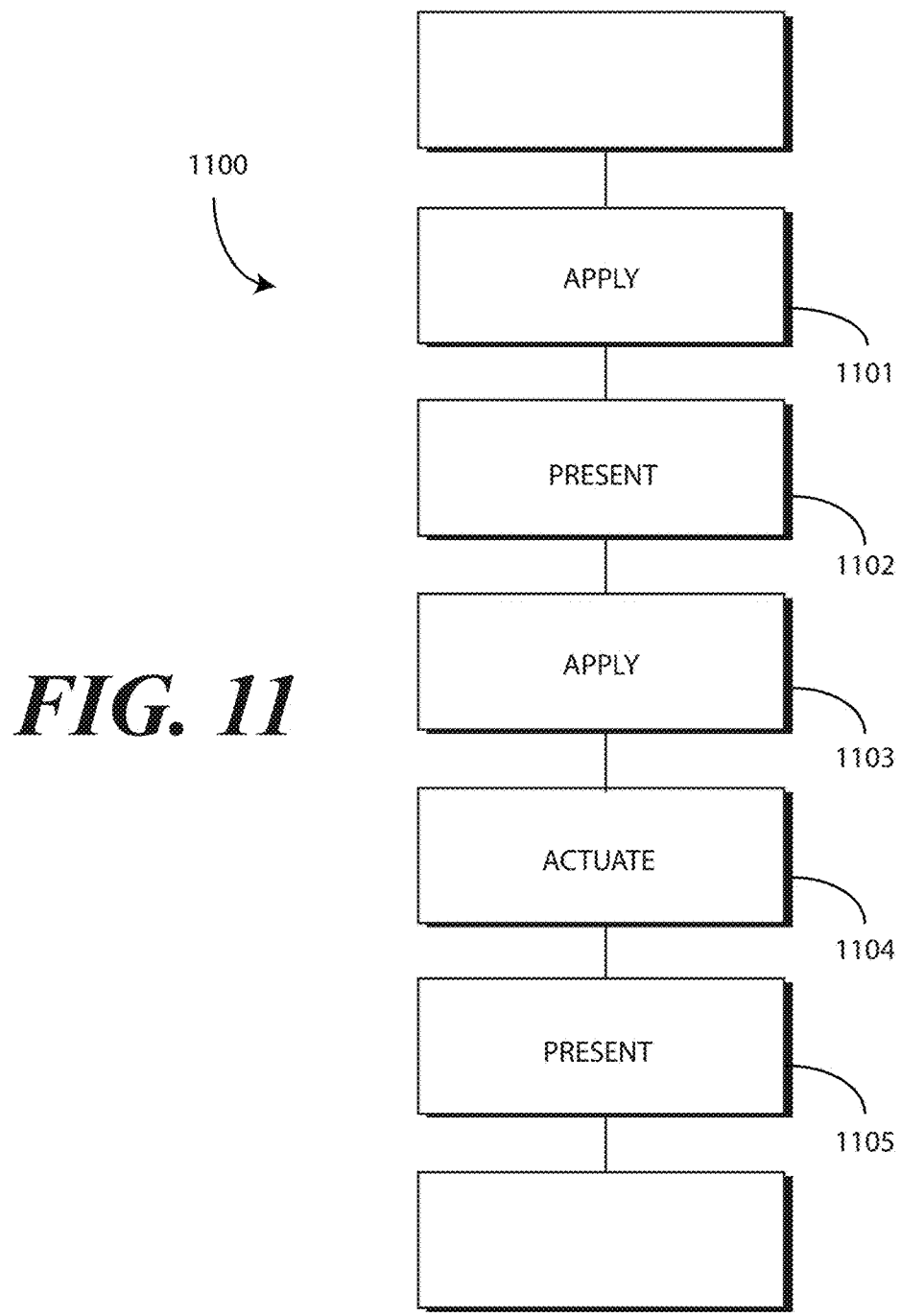
FIG. 11 illustrates an explanatory method operating in accordance with one or more embodiments of the disclosure.

Turning now to FIG. 11, illustrated therein is one method 1100 configured in accordance with one or more embodiments of the disclosure. Beginning at step 1101, the method 1100 applies, with a first electrode assembly, a first electric field to one or more electrophoretic capsules. At step 1101, this application of the electric field causes operation of the one or more electrophoretic capsules in an optically non-transmissive mode. At step 1102, the method 1100 arranges the one or more electrophoretic capsules—using the first electric field—to present indicia on the display. As the one or more electrophoretic capsules are operating in the optically non-transmissive mode, charged pigments within the capsules present the indicia on the display by reflecting incident light.

At step 1103, the method 1100 applies, with a second electrode assembly, a second electric field to the one or more electrophoretic capsules. In one embodiment, the first electric field is applied in step 1101 is applied in a direction substantially orthogonal with another direction of the second electric field applied at step 1103. At step 1103, this causes the one or more electrophoretic capsules to operate in an optically transmissive mode.

At step 1104, the method 1100 comprises actuating one or more light emitting devices when operating the one or more electrophoretic capsules in the optically transmissive mode as indicated by step 1103. At step 1105, the method 1100 includes controlling the one or more light emitting devices to present indicia on the display when operating the one or more electrophoretic capsules in the optically transmissive mode.

It should be noted that the various steps of FIG. 11 could be performed out of order. Illustrating by example, steps 1103,1104,1105 could precede steps 1101,1102. Other orders will be obvious to those of ordinary skill in the art having the benefit of this disclosure.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A display for an electronic device, comprising a plurality of pixel portions, each pixel portion comprising:
   one or more electrophoretic capsules;
   a first electrode assembly and a second electrode assembly; and
   a control circuit selectively controlling the first electrode to cause operation of the one or more electrophoretic capsules in an optically non-transmissive state and the second electrode assembly to cause operation of the one or more electrophoretic capsules in an optically transmissive state, the second electrode assembly applying a stronger electric field to the one or more electrophoretic capsules than the first electrode assembly when in operation.

2. The display of claim 1, the each pixel portion further comprising one or more light emitting devices, the control circuit selectively actuating the one or more light emitting devices when the one or more electrophoretic capsules operate in the optically transmissive state.

3. The display of claim 2, the second electrode assembly applying a second electric field to the one or more electrophoretic capsules that is substantially orthogonal to a first electric field applied by the first electrode assembly when in operation.

4. The display of claim 2, the first electrode assembly comprising a first electrode structure and a second electrode structure, the second electrode assembly comprising a third electrode structure and a fourth electrode structure.

5. The display of claim 4, the each pixel portion comprising a subpixel, the one or light emitting devices comprising a single light emitting device.

6. The display of claim 4, the one or more electrophoretic capsules disposed between the first electrode structure and the second electrode structure along a first axis, and between the third electrode structure and the fourth electrode structure along a second axis.

7. The display of claim 6, the first axis substantially orthogonal with the second axis.

8. The display of claim 6, the second electrode structure disposed between the one or more electrophoretic capsules and the one or more light emitting devices.

9. The display of claim 6, the first electrode structure disposed along a first substrate, the second electrode structure disposed along a second substrate.

10. The display of claim 9, the third electrode structure and the fourth electrode structure disposed between the first substrate and the second substrate.

11. The display of claim 10, further comprising an optically non-transmissive material disposed along the first substrate at locations corresponding to the third electrode structure and the fourth electrode structure.

12. An electronic device, comprising:
   a housing;
   a fascia defining a major face of the housing; and
   a display disposed between the housing and the fascia;
   the display comprising a plurality of pixel portions, each pixel portion comprising:
      one or more electrophoretic capsules; and
      a first electrode assembly and a second electrode assembly;
      the one or more electrophoretic capsules operating in an optically non-transmissive state when the first electrode assembly applies a first electric field to the one or more electrophoretic capsules, and rotating to operate in an optically transmissive state when the second electrode assembly applies a second electric field to the one or more electrophoretic capsules.

13. The electronic device of claim 12, the first electric field substantially orthogonal to the second electric field.

14. The electronic device of claim 12, further comprising a control circuit operable with the first electrode assembly and the second electrode assembly.

15. The electronic device of claim 14, further comprising one or more light emitting devices, the control circuit actuating the one or more light emitting devices when the second electrode assembly applies the second electric field to the one or more electrophoretic capsules.

16. The electronic device of claim 15, the first electrode assembly comprising a first electrode structure and a second electrode structure, the one or more electrophoretic capsules and the one or more light emitting devices disposed between the first electrode structure and the second electrode structure.

17. A method of controlling a display, the method comprising:
applying, with a first electrode assembly, a first electric field to one or more electrophoretic capsules when operating the one or more electrophoretic capsules in an optically non-transmissive mode; and
applying, with a second electrode assembly, a second electric field to the one or more electrophoretic capsules when operating the one or more electrophoretic capsules in an optically transmissive mode;
wherein the first electric field is applied in a direction substantially orthogonal with another direction of the second electric field, wherein the second electric field is stronger than the first electric field.

18. The method of claim 17, further comprising arranging the one or more electrophoretic capsules with the first electric field to present indicia on the display when operating the one or more electrophoretic capsules in the optically non-transmissive mode.

19. The method of claim 17, further comprising actuating one or more light emitting devices when operating the one or more electrophoretic capsules in the optically transmissive mode.

20. The method of claim 19, further controlling the one or more light emitting devices to present indicia on the display when operating the one or more electrophoretic capsules in the optically transmissive mode.

* * * * *